United States Patent
Lima

(10) Patent No.: US 8,952,524 B2
(45) Date of Patent: Feb. 10, 2015

(54) RE-WORKABLE HEAT SINK ATTACHMENT ASSEMBLY

(75) Inventor: David J. Lima, Los Altos, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 1230 days.

(21) Appl. No.: 11/380,778

(22) Filed: Apr. 28, 2006

(65) Prior Publication Data

US 2008/0271875 A1 Nov. 6, 2008

(51) Int. Cl.
*F28F 7/00* (2006.01)
*H01L 23/373* (2006.01)
*H01L 23/34* (2006.01)
*H01L 23/36* (2006.01)
*H01L 21/48* (2006.01)
*H01L 23/40* (2006.01)
*H01L 23/00* (2006.01)

(52) U.S. Cl.
CPC ............ *H01L 23/3735* (2013.01); *H01L 23/34* (2013.01); *H01L 23/36* (2013.01); *H01L 21/4882* (2013.01); *H01L 23/3737* (2013.01); *H01L 23/40* (2013.01); *H01L 24/28* (2013.01); *H01L 24/83* (2013.01); *H01L 2224/838* (2013.01); *H01L 2924/01013* (2013.01); *H01L 2924/01029* (2013.01); *H01L 2924/01033* (2013.01); *H01L 2924/01047* (2013.01); *H01L 2924/01075* (2013.01); *H01L 2924/01082* (2013.01); *H01L 2924/14* (2013.01); *H01L 2224/2919* (2013.01); *H01L 2924/014* (2013.01); *H01L 2924/0665* (2013.01)
USPC ............................ 257/706; 257/712; 257/713

(58) Field of Classification Search
CPC ......... H01L 23/34; H01L 23/36; H01L 23/40; H01L 2023/4056
USPC ........................... 257/706, E23.083, 712, 713
See application file for complete search history.

(56) References Cited

U.S. PATENT DOCUMENTS

| | | | | |
|---|---|---|---|---|
| 4,914,551 A | * | 4/1990 | Anschel et al. | 361/714 |
| 5,272,375 A | * | 12/1993 | Belopolsky | 257/717 |
| 5,533,256 A | * | 7/1996 | Call et al. | 29/840 |
| 5,825,087 A | * | 10/1998 | Iruvanti et al. | 257/707 |
| 5,881,944 A | * | 3/1999 | Edwards et al. | 228/56.3 |

(Continued)

FOREIGN PATENT DOCUMENTS

| CN | 1 120 736 A | 4/1996 |
|---|---|---|
| EP | 0 693 780 A2 | 1/1996 |

OTHER PUBLICATIONS

Merrill M. Minges, Electronic Materials Handbook: Packaging; vol. 1, 1st ed., CRC, Nov. 1, 1999, p. 411, ISBN: 978-0871702852.*

(Continued)

*Primary Examiner* — Peniel M Gumedzoe
(74) *Attorney, Agent, or Firm* — Harrity & Harrity, LLP

(57) ABSTRACT

A re-workable heat dissipation assembly may include a non-removable adhesive layer. A first interposer layer may be adhered to a device via the non-removable adhesive layer. A removable adhesive layer may be adhered to the first interposer layer. A heat dissipation assembly may be adhered to the removable adhesive layer. Use of an interposer layer and a removable adhesive layer in combination with a non-removable adhesive layer, provides a high performance heat dissipation assembly while enabling re-working of the assembly following initial manufacture.

20 Claims, 6 Drawing Sheets

(56) References Cited

U.S. PATENT DOCUMENTS

| | | | |
|---|---|---|---|
| 5,956,576 A * | 9/1999 | Toy et al. | 438/125 |
| 5,990,550 A * | 11/1999 | Umezawa | 257/712 |
| 6,111,313 A * | 8/2000 | Kutlu | 257/697 |
| 6,261,404 B1 * | 7/2001 | Baska et al. | 156/310 |
| 6,292,369 B1 * | 9/2001 | Daves et al. | 361/719 |
| 6,380,621 B1 * | 4/2002 | Ando et al. | 257/707 |
| 6,462,410 B1 * | 10/2002 | Novotny et al. | 257/707 |
| 6,706,562 B2 * | 3/2004 | Mahajan et al. | 438/125 |
| 6,734,552 B2 * | 5/2004 | Combs et al. | 257/707 |
| 2003/0116272 A1 | 6/2003 | Aubert | |
| 2003/0141586 A1 | 7/2003 | Alcoe et al. | |
| 2004/0018661 A1 * | 1/2004 | Baek et al. | 438/109 |
| 2004/0218354 A1 * | 11/2004 | Lee et al. | 361/687 |
| 2005/0077615 A1 * | 4/2005 | Yu et al. | 257/706 |
| 2005/0139998 A1 * | 6/2005 | Fitzgerald et al. | 257/713 |
| 2005/0256241 A1 | 11/2005 | Sachdev et al. | |

OTHER PUBLICATIONS

The European Search Report for corresponding European Application No. 07251774.1, dated May 29, 2008, 6 pages.

\* cited by examiner

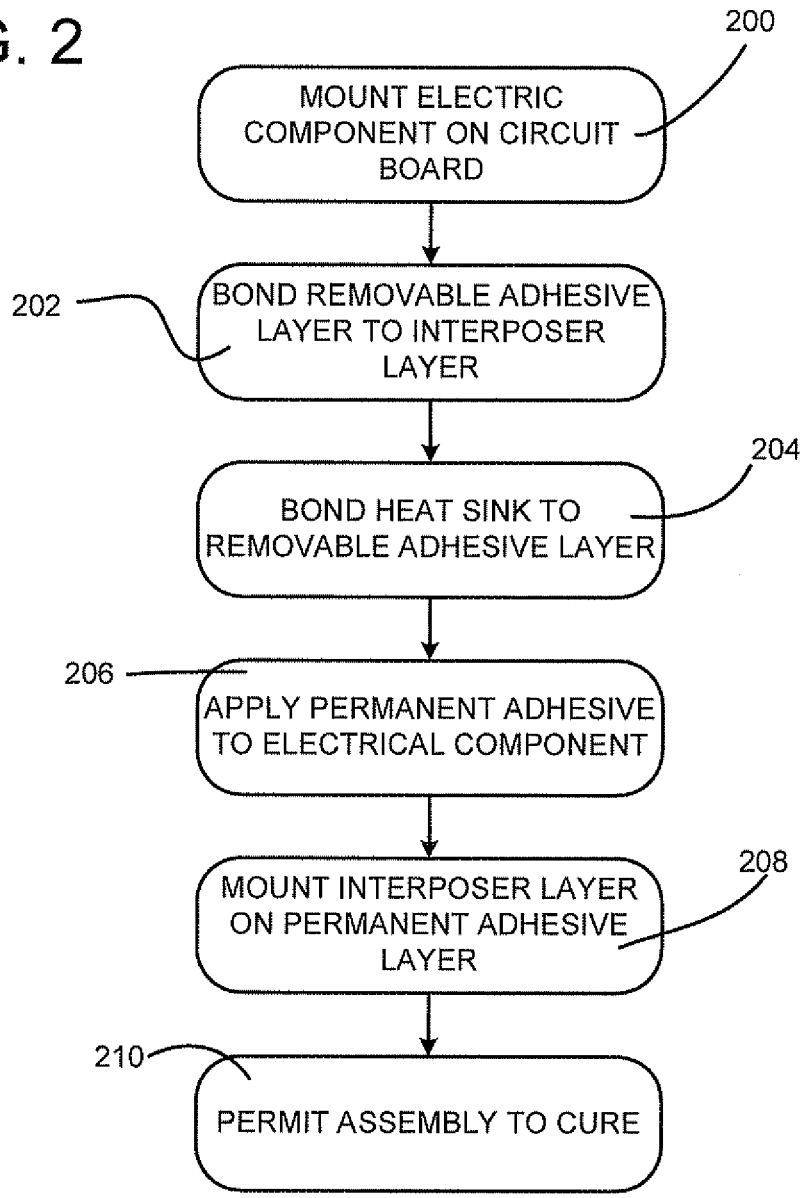

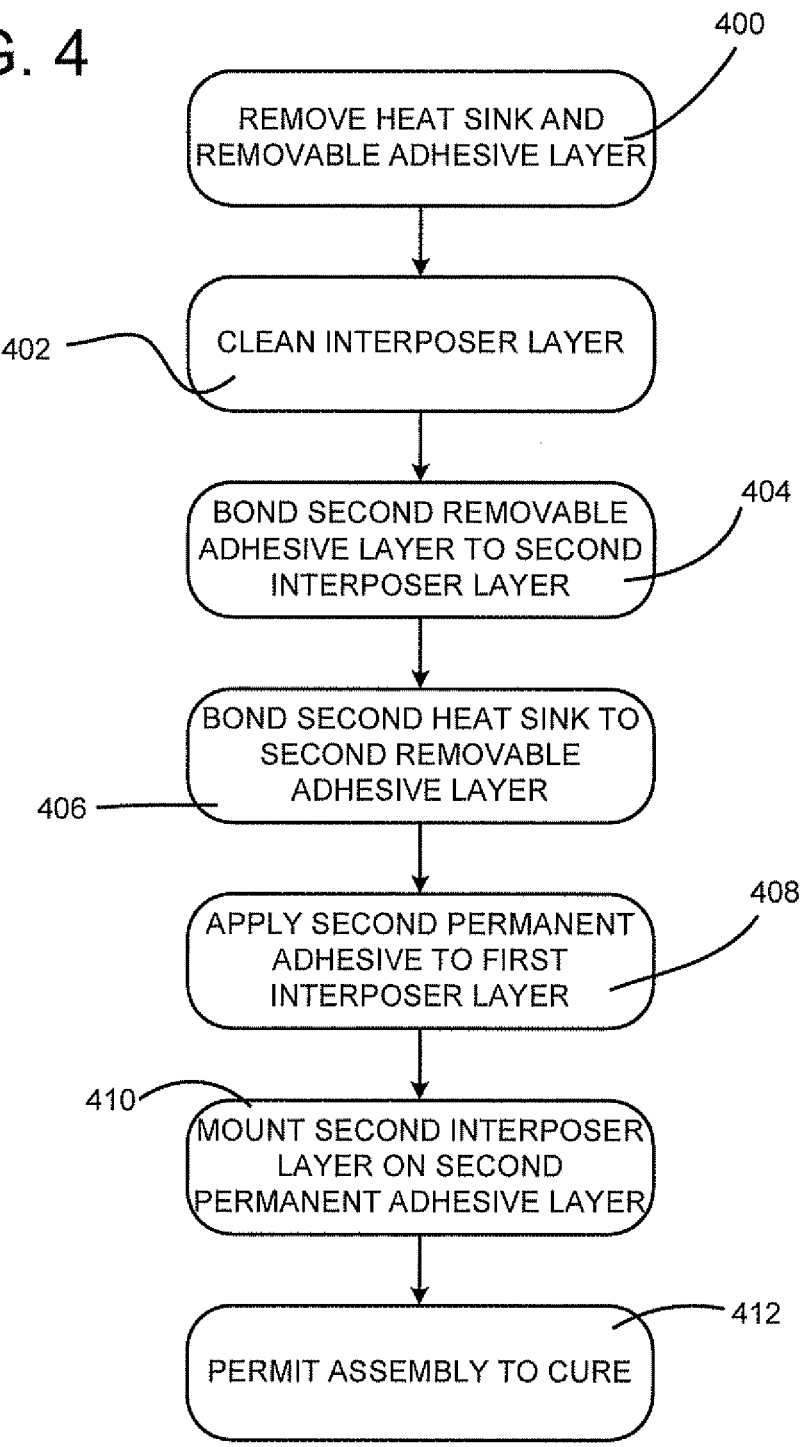

RE-WORKABLE HEAT SINK ATTACHMENT ASSEMBLY

TECHNICAL FIELD OF THE INVENTION

Implementations consistent with the principles of the invention relate generally to heat dissipation and more particularly, to a high performance, re-workable heat dissipating assembly.

DESCRIPTION OF RELATED ART

Many electronic devices include circuit boards incorporating various electronic elements necessary to operate the device. A typical circuit board may include a section of circuit board material such as a fiberglass base, copper etchings, vias, etc. Circuit board components may then be attached or mounted to the section of circuit board material. Some examples of circuit board components may include integrated circuits (ICs), processors, memory slots, and on-board peripheral connectors (e.g., USB, IEEE 1394, etc.). Many of these circuit board components generate heat as a byproduct of their operation. In many situations, a fan assembly may be used to generate an air stream that passes over the components and conducts heat from the components.

In addition to or as a replacement to fan assemblies, circuit board components may include heat sinks to facilitate cooling. In general, a heat sink is device formed of heat conductive material that is thermally connected to the circuit board component. Typically, heat sinks are formed to include shapes designed to increase an amount of surface area susceptible to convective cooling, such as fins, ribs or flanges. As the component generates heat, heat flows from the component to the heat sink, and dissipates into the surrounding air by convection which may be assisted by additional cooling assemblies, such as air flow from a fan assembly or other assemblies including liquid based cooling devices. The air stream generated by the fan assembly then carries the heat away, thus cooling the electronic component.

Existing heat dissipation devices or heat sinks may be affixed to the devices to be cooled in numerous ways. Some implementations utilize mechanical devices for securing the heat sink to the device, such as clips, clamps, screws, springs, or other mechanical fasteners. Such mechanical devices typically increase the overall cost and complexity of the device and may constrict physical implementations of the devices by consuming valuable space on the printed circuit assembly.

Various adhesive implementations may also be used to secure heat sinks to devices to be cooled. Existing adhesive solutions fall into two general categories, permanent liquid or viscous adhesives that cure with some combination of chemical change, time, temperature and humidity conditions, and pressure-sensitive, removable adhesives. Each of these solutions suffers from application and utility problems. For example, adhesive solutions using permanent adhesives such as thermally conductive epoxy or methacrylates typically do not provide for any removal or non-destructive disassembly of the assembled device. Accordingly, should the device require service or maintenance, removal of the heat sink is greatly inhibited. Economical removal and replacement of heat sinks is required to be able to test and repair circuit assemblies.

Conversely, pressure-sensitive, removable adhesives, such as thermally conductive tapes, generally require the application of potentially damaging force to affect a suitable bond strength between the heat sink and the device to be cooled. Such pressure must be applied for a pre-determined time to cause the adhesive to flow or wet the surfaces of the parts being joined. This pressure may easily damage delicate circuit devices or the printed circuit assembly. Furthermore, suitable thermal performance may require machined or substantially planar surfaces for both the heat sink and the device to be cooled. This may increase the cost of manufacturing and effective assembly.

Pressure-sensitive removable tape adhesives generally have lower thermal performance than permanent adhesives; however, the advantage of removable adhesive is that it accommodates the need to remove and replace heatsinks for testing and repair purposes.

SUMMARY

According to one aspect consistent with principles of the invention, a re-workable heat dissipation assembly is provided. The re-workable heat dissipation assembly may include a non-removable adhesive layer; a first interposer layer adhered to a device via the non-removable adhesive layer; a removable adhesive layer adhered to the first interposer layer; and a heat dissipation assembly adhered to the removable adhesive layer.

In accordance with another aspect consistent with principles of the invention, a method for assembling a re-workable heat dissipation device may be provided. The method may include applying a first surface of a removable adhesive layer to a first surface of an interposer layer; applying a heat dissipation device to a second surface of the removable adhesive layer; applying a non-removable adhesive layer to a first surface of a device to be cooled; and bonding a second surface of the interposer layer to the non-removable adhesive layer.

In accordance with yet another aspect consistent with principles of the invention, a re-workable heat sink attachment assembly may be provided including a thermally conductive metallic interposer layer permanently bonded to a device to be cooled by a non-removable adhesive layer; and heat dissipation assembly removably bonded to the metallic interposer layer by a removable adhesive layer.

BRIEF DESCRIPTION OF THE DRAWINGS

Reference is made to the attached drawings, wherein elements having the same reference number designation may represent like elements throughout.

FIG. 2 is a flow diagram illustrating one exemplary method for assembling a device in accordance with principles of the invention;

FIG. 4 is a flow diagram illustrating another exemplary method for assembling a device in accordance with principles of the invention.

DETAILED DESCRIPTION

The following detailed description of the invention refers to the accompanying drawings. The same reference numbers in different drawings may identify the same or similar elements. Also, the following detailed description does not limit the invention. Instead, the scope of the invention is defined by the appended claims and equivalents.

Figure 1A:
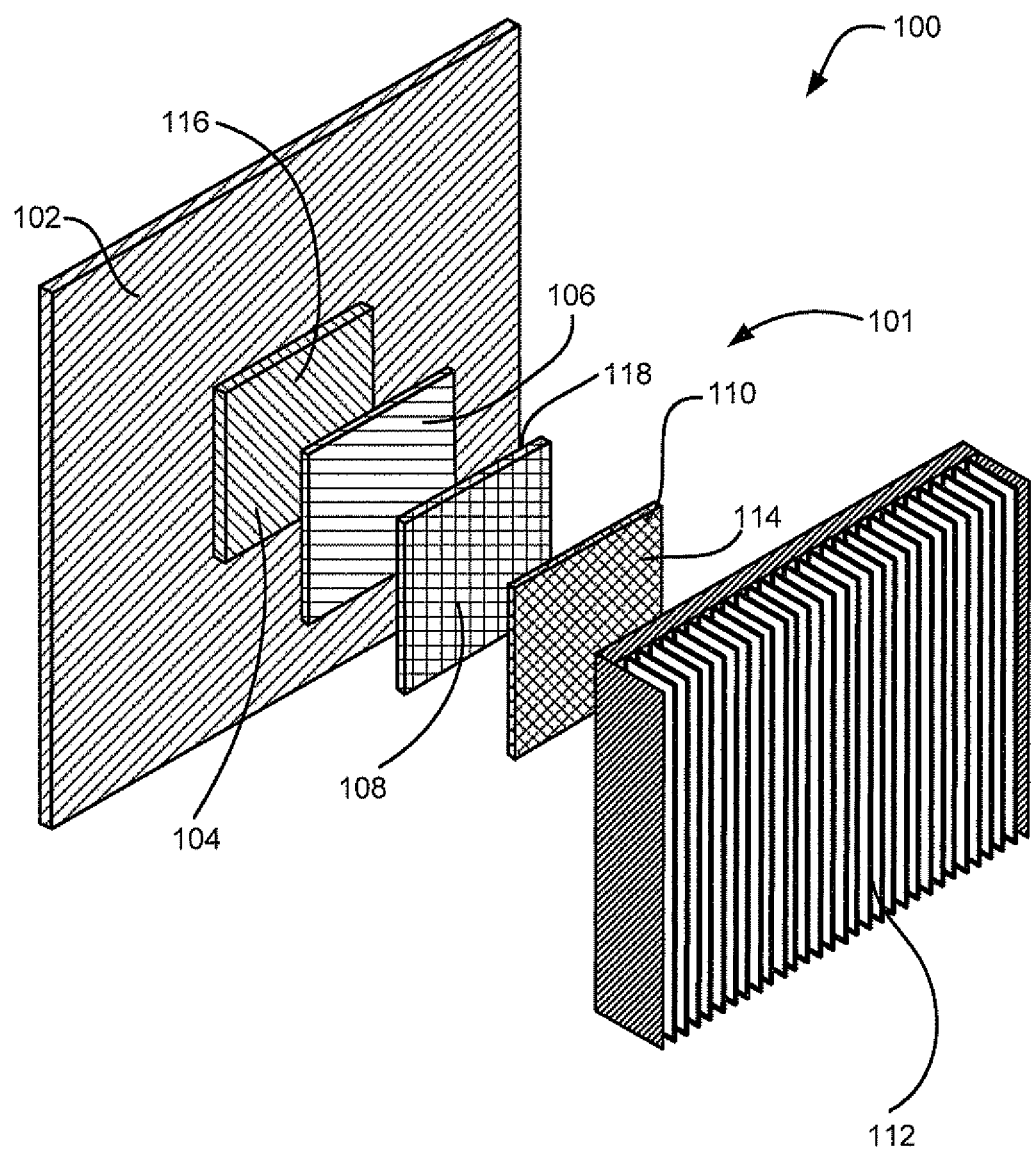
FIG. 1A is an exploded isometric view of an electrical device including a re-workable heat sink attachment assembly in accordance with one implementation consistent with principles of the invention.
Figure 1B:
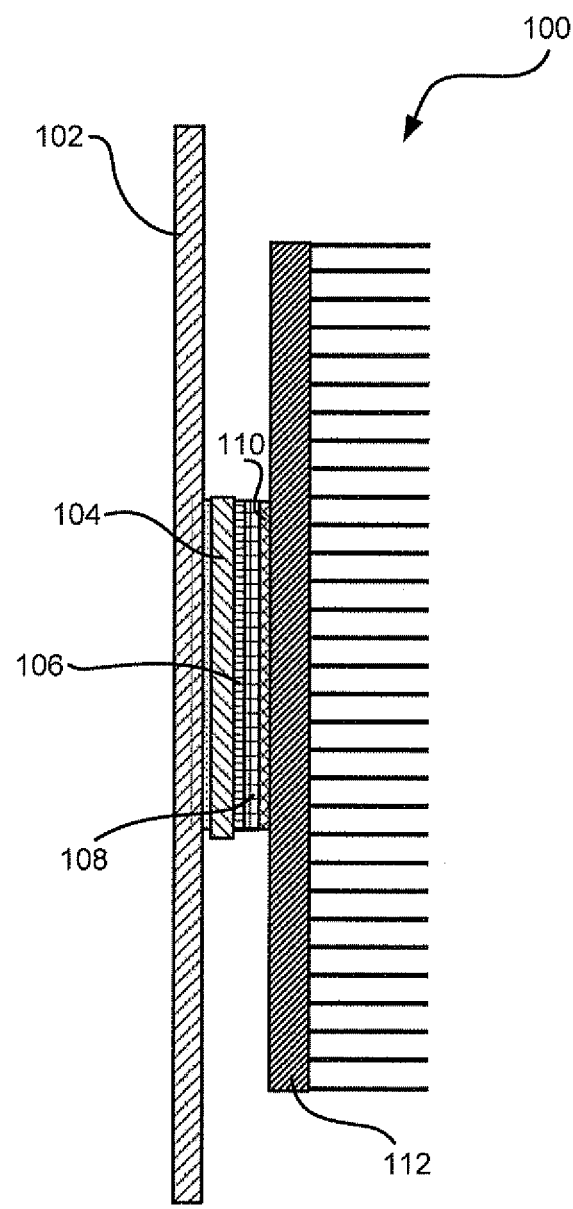
FIG. 1B is a side-view of an assembled device incorporating a re-workable heat sink attachment assembly in accordance with one implementation consistent with principles of the invention.

FIG. 1A is an exploded isometric view of an electrical device 100 including a re-workable heat sink attachment assembly 101 in accordance with one implementation consistent with principles of the invention. FIG. 1B is a side-view of an assembled device 100 incorporating re-workable heat sink attachment assembly 101 in accordance with one implementation consistent with principles of the invention. Although described here in the context of heat sink-type heat dissipation assembly, it should be understood that alternative types of convective-based heat dissipation devices may be similarly implemented, such as heat pipes, water-based heat removal assembly, etc.

As shown in FIG. 1, electrical device 100 may include a circuit board assembly 102, an electrical component 104, a first thermally conductive adhesive layer 106, an interposer layer 108, a second thermally conductive adhesive layer 110, and a heat sink 112.

In accordance with one implementation consistent with principles of the invention, circuit board assembly 102 may be formed of any suitable material or collection of materials, such as e.g., fiberglass, copper, etc. formed to support operation of an electronic device. Such an electronic device may include any type of device wherein electrical components are used to effect operation of the device. Examples include computers, servers, network devices, and consumer electronic devices (e.g., DVD players, gaming consoles, stereo equipment, etc).

Electrical component 104 may include the electrical component to be cooled and may include any heat generating component for use in conjunction with circuit board assembly 102. One non-limiting example of such an electrical component may include a silicone microprocessor. Electrical component 104 may be attached or secured to circuit board assembly 102 by any suitable assembly including, but not limited to, one or more soldered connections, a friction socket, a friction slot, a mechanical clip, or adhesive assembly.

Turning to first thermally conductive adhesive layer 106, in one implementation consistent with principles of the invention, first thermally conductive adhesive layer may be a low or no-pressure adhesive assembly such as a thermally conductive epoxy adhesive, a thermally conductive urethane adhesive, a thermally conductive methacrylate adhesive, or a thermally conductive silicon adhesive. Such thermally conductive liquid or viscous, low or no-pressure adhesive assembly may include conductive particles, such as aluminum oxide or silver particles distributed therein to afford a suitable thermal conducting performance.

In one embodiment, first thermally conductive adhesive layer 106 may be applied in a non-cured state to an upper surface 116 of electrical component 104. A lower surface 118 of interposer layer 108 may then be positioned over the first conductive layer 106 with the combined assembly permitted to cure through the passage of time or application of heat and/or humidity to the assembly. As is known, such low or no-pressure adhesives of layer 106 are substantially permanent in that separation of bonded layers typically results in damage or destruction of one or both of the layers. Furthermore, layer 106 may be formed of a material suitable for bonding or joining non-planar or irregular surfaces. More specifically, the fluid nature of pre-cured layer 106 may fill any gaps or irregularities between upper surface 116 of electrical component 104 and lower surface 118 of interposer layer 108, which aids in substantially increasing the thermal performance of the adhesive layer. In one implementation consistent with principles of the invention, first thermally conductive adhesive layer 106 may have a cured thickness of approximately 0.001 to 0.020 inches.

In accordance with principles of the invention, second thermally conductive adhesive layer 110 may be a re-workable or removable adhesive layer used to bond interposer layer 108 to heat sink 112. In one exemplary implementation, interposer layer 108 may be formed of a metallic or otherwise thermally conductive material, such as aluminum or copper. Similarly, heat sink 112 may also be formed of such thermally conductive materials, so as to provide a maximum amount of convective cooling. In one embodiment, second thermally conductive adhesive layer 110 may include a high-pressure thermally conductive tape for bonding or joining interposer layer 108 to heat sink 112.

Examples of suitable thermally conductive tape may include THERMATTACH® T410, T410-R and T411 Thermal Tapes from Chomerics, Division of Parker Hannifin Corporation, BONDPLY 105, 108 and 111 from Bergquist Corporation, and Thermally Conductive Tapes 8820, 9894FR, 8805, 8810, 8815, 9882, 9885, 9890, and 9892FR from 3M, although any suitable thermally conductive adhesive tape may be used without departing from the scope of the invention. In one embodiment consistent with the invention, thermally conductive layer 110 may be approximately 0.001-0.011 inches thick.

In one implementation consistent with principles of the invention, interposer layer 108 may include a thermally conductive foil (e.g., aluminum foil) or other thin thermally conductive material calendared or otherwise adhesively attached to a lower surface (not shown) of thermally conductive tape layer 110. Interposer layer 108 should have a thermal conductivity sufficient to effective conduct heat while causing very little temperature rise in electrical component 104. In one illustrative embodiment, foil interposer layer 108 may be approximately 0.001-0.080 inches thick. The minimal thickness of interposer layer 108 enhances the thermal conductivity of layer 108 and enables layer 108 to flex and conform to the shape of heat sink 112, thus enabling the bond between thermally conductive layer 110 and interposer layer 108 to be thin and completely wetted. Additionally, the thinness of interposer layer 108 also allows it to stretch and compress with temperature cycling in its planar dimensions. This reduces the stress on electrical component 104 due to differential thermal expansion (DTE) during temperature cycling. If the interposer were thick and rigid, the differential thermal expansion could cause warpage and cracking of the assembly.

In additional implementations consistent with principles of the invention, interposer layer 108 may be formed of a highly flexible, thermally conductive material. Such a material enables interposer layer 138 to be "laminated" to the heat sink 112 with second thermally conductive layer 110 to get a substantially 100% adhesive contact area between interposer layer 108 and heat sink 112.

As is known in the art, thermally conductive tape solutions require at least a minimal amount of force to sufficiently bond the tape adhesive to the interposer layer 108 and the heat sink 112. As discussed above, in one implementation consistent with principles of the invention, interposer layer 108 may be adhered to the lower surface of second thermally conductive adhesive layer 10 during a calendaring or other high-pressure application technique. Additionally, an upper surface 114 of second thermally conductive adhesive layer 110 may be bonded to heat sink 112 through use of any suitable pressure application assembly. Such assembly may be performed mechanically or physically by a device assembler. By enabling application of suitable bonding forces to interposer layer 108, second thermally conductive adhesive layer 110 and heat sink 112, optimal thermal performance may be obtained without risk of damage to underlying electrical component 104 or circuit board 102. Additionally, the ability to apply force to interposer layer 108 and heat sink 112 to affect bonding with second thermally conductive adhesive layer 110 enables the use or non-uniform, irregular, or non-planar surfaces for layers 108 and 110. An ability to accommodate such surfaces provides substantial cost savings to the manufacture of the cooling assembly.

In one implementation, this "off-line" lamination of pressure-sensitive tape layer 110 to heat sink 112 has the additional benefit of allowing very high pressure, which ensures 100% wetting of both adhesive surfaces, which in turn ensures maximum thermal performance of the bond.

In a manner consistent with principles of the invention, the mounted heat sink assembly includes two very thin and very high thermally performing adhesive layers (one permanent one 106 and one removable one 110) and a very thin and high thermal performance interposer layer 108. After one or more rework cycles (as described in detail below, with respect to FIGS. 3A-3B) the assembly maintains a very high thermal performance in a compact and durable package.

FIG. 2 is a flow diagram illustrating one exemplary method for assembling device 100 in accordance with principles of the invention. Initially, processing may begin with mounting of electrical component 104 on circuit board 102 (act 200). A lower surface of second thermally conductive adhesive layer 110 may be bonded to an upper surface of interposer layer 108 (act 202). As described above, in one implementation consistent with principles of the invention, such bonding may be performed by a calendaring or other high-pressure assembly. A lower surface of heat sink 112 may be bonded to an upper surface of second thermally conductive adhesive layer 110 (act 204).

First thermally conductive adhesive layer 106 may be applied to an upper surface of electrical component 104 in an uncured (e.g., fluid) state (act 206). As described above, first thermally conductive adhesive layer 106 may be a low or no-pressure adhesive e.g., an epoxy or urethane adhesive. The interposer layer 108/second thermally conductive adhesive layer 110/heat sink 112 assembly may then be mounted or positioned on an upper surface of first thermally conductive adhesive layer 106 while still in an uncured state (act 208). Device 100 is then permitted to cure (act 210), resulting in a substantially permanent bond between electrical component 104 and first interposer layer 108 via first thermally conductive adhesive layer 106.

Figure 3A:
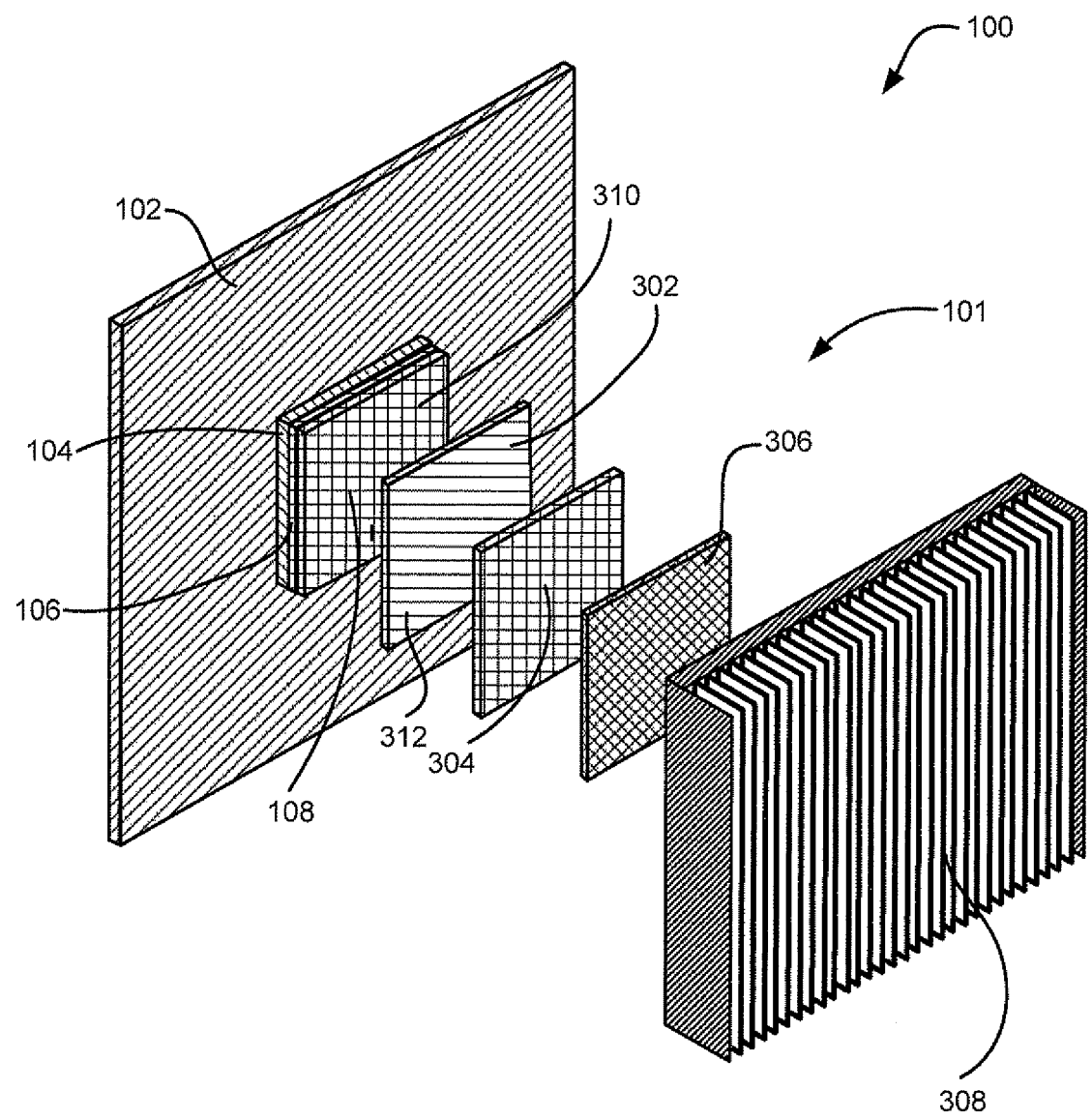
FIG. 3A is an exploded isometric view of re-workable heat sink attachment assembly in accordance with another implementation consistent with principles of the invention.
Figure 3B:
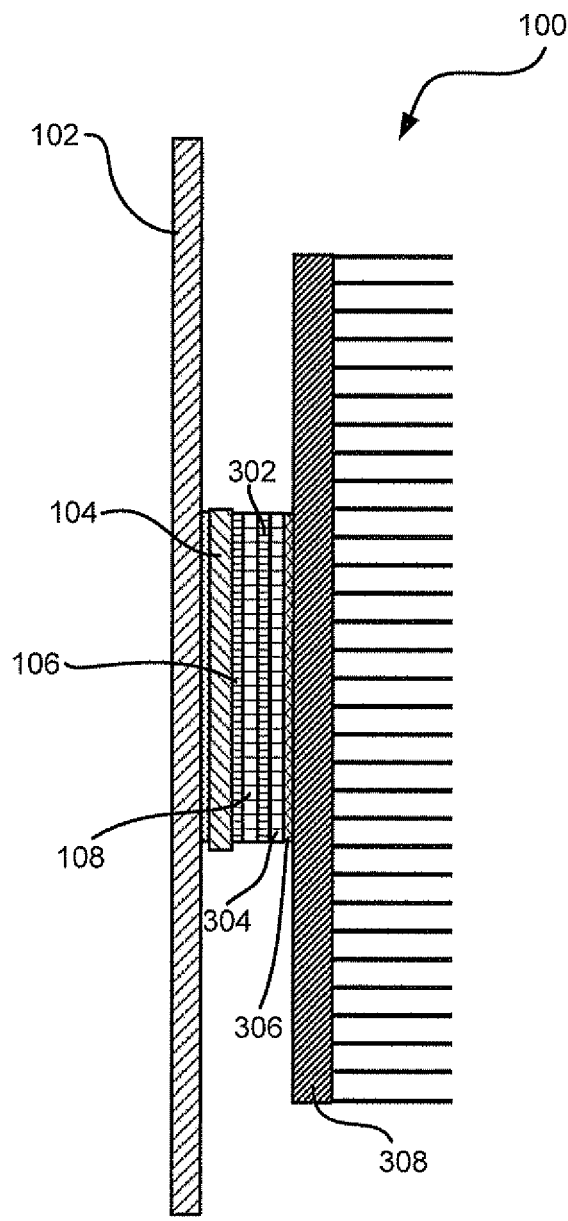
FIG. 3B is a side-view of an assembled device incorporating a re-workable heat sink attachment assembly in accordance with another implementation consistent with principles of the invention.

FIG. 3A is an exploded isometric view of re-workable heat sink attachment assembly 101 following removal of an initial heat sink 112 and second thermally conductive adhesive layer 110 and pending application of a third thermally conductive adhesive layer 302, a second interposer layer 304, a fourth thermally conductive adhesive layer 306, and a second heat sink 308. FIG. 3B is a side-view of an assembled device 100 incorporating re-workable heat sink attachment assembly 101 following attachment of second heat sink 308 in accordance with one implementation consistent with principles of the invention.

As shown, electrical component 104, first thermally conductive adhesive layer 106 and interposer layer 108 may remain attached to circuit board 102. Following removal of second thermally conductive adhesive layer 10 and heat sink 112 (FIGS. 1A and 1B) from upper surface 310 of interposer layer 108, any remaining remnants of adhesive layer 110 may be cleaned or otherwise removed from upper surface 310 of interposer layer 110 using any suitable method (e.g. alcohol, etc.).

Once device 100 is to be re-assembled, second interposer layer 304 may be bonded to second heat sink 308 using fourth thermally conductive adhesive layer 306 in a manner similar to the manner set forth above regarding interposer layer 108, second thermally conductive adhesive layer 110 and heat sink 112. That is, respective sides of a thermally conductive tape may be forcibly bonded to each of second interposer layer 304 and second heat sink 308 to affect a bond therebetween.

Following bonding of fourth thermally conductive adhesive layer 306 to second interposer layer 304 and second heat sink 308, third thermally conductive adhesive layer 302 may be applied in an uncured state to upper surface 310 of first interposer layer 108 in a manner substantially similar to the application of first thermally conductive adhesive layer 106 to electrical component 104. The assembly including second interposer layer 304, fourth thermally conductive adhesive layer 306, and second heat sink 308 may then be applied to an upper surface 312 of third thermally conductive adhesive layer 302. The resulting assembly is then permitted to cure, thereby rendering the second interposer layer 304 substantially permanently bonded to electrical component 104, with second heat sink 308 being substantially removably bonded to second interposer layer 304 with fourth thermally conductive adhesive layer 306.

As described above, the reduced thicknesses of interposer layer 108 and interposer layer 304 allow the overall height of the assembly to be as thin as possible, thus enabling multiple re-work cycles while maintaining the device within package constraints.

FIG. 4 is a flow diagram illustrating one exemplary method for re-assembling device 100 in accordance with principles of the invention. Initially, processing may begin with the removal or disassembly of heat sink 112 and second thermally conductive adhesive layer 110 from device 100 (act 400). Following disassembly, an upper surface of first interposer layer 108 may be cleaned to provide a suitable adhesion service (act 402). A lower surface of fourth thermally conductive adhesive layer 306 may be bonded to an upper surface of second interposer layer 304 (act 404). As described above, in one implementation consistent with principles of the invention, such bonding may be performed by a calendaring or other high-pressure operation. A lower surface of second heat sink 308 may then be bonded to an upper surface of second thermally conductive adhesive layer 306 (act 406).

Third thermally conductive adhesive layer 302 may be applied to an upper surface of first interposer layer 108 in an uncured (e.g., fluid) state (act 408). The second interposer layer 304/fourth thermally conductive adhesive layer 306/second heat sink 308 assembly may be mounted or positioned on an upper surface of third thermally conductive adhesive layer 302 while still in an uncured state (act 410). Device 100 may be permitted to cure (act 412), resulting in a substantially permanent bond between both electrical component 104 and first interposer layer 108 as well as between first interposer layer 108 and second interposer layer 304 via the first and third thermally conductive adhesive layers 106 and 302, respectively.

By providing both low or no-pressure, permanent adhesion as well as higher pressure, removable adhesion, excellent thermal conductivity and heat dissipation may be provided in a re-workable heat sink assembly, with minimal risk of damage to underlying electrical devices or components.

CONCLUSION

Implementations consistent with principles of the invention provide an improved, re-workable heat sink attachment assembly, where high thermal dissipation and conductivity may be realized in a removable assembly.

The foregoing description of the embodiments of the invention provides illustration and description, but is not intended to be exhaustive or to limit the invention to the precise form disclosed. Modifications and variations are possible in light of the above teachings or may be acquired from practice of the invention.

For example, the preceding embodiments have been described in the context of a heat sink-type thermal dissipation assembly. However, the principles of the invention may be used with other types of heat dissipation devices, such as heat pipes, water-cooled heat dissipation assembly, etc.

Further, while series of acts have been described with respect to FIGS. 2 and 4, the order of the acts may be varied in other implementations consistent with the invention. Moreover, non-dependent acts may be performed in parallel with other non-dependent acts.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

The scope of the invention is defined by the claims and their equivalents.

What is claimed is:

1. A re-workable heat dissipation assembly comprising:
a substantially permanent first adhesive layer,
the substantially permanent first adhesive layer having a first dimension and a second dimension;
a first interposer layer adhered to an electronic device via the substantially permanent first adhesive layer,
the first interposer layer having the first dimension and the second dimension;
a second adhesive layer adhered to the first interposer layer,
the second adhesive layer comprising a thermally conductive tape, and
the second adhesive layer having the first dimension and the second dimension;
a second interposer layer adhered to the second adhesive layer,
the second interposer layer having the first dimension and the second dimension;
a third adhesive layer adhered to the second interposer layer,
the third adhesive layer having the first dimension and the second dimension; and
a heat dissipation device adhered to the first interposer layer via the third adhesive layer,
at least one of the first interposer layer or the second adhesive layer including a non-uniform, irregular, or non-planar surface.

2. The assembly of claim 1, where the substantially permanent first adhesive layer comprises a thermally conductive adhesive layer.

3. The assembly of claim 1, where the substantially permanent first adhesive layer comprises a low pressure adhesive layer.

4. The assembly of claim 1, where the substantially permanent first adhesive layer comprises an epoxy adhesive layer.

5. The assembly of claim 1, where the first interposer layer comprises a heat conductive layer.

6. The assembly of claim 1, where the first interposer layer comprises a metallic heat conductive layer.

7. The assembly of claim 1, where the first interposer layer comprises aluminum.

8. The assembly of claim 1, where the first interposer layer comprises a metallic foil.

9. The assembly of claim 1, where the first interposer layer comprises copper.

10. The assembly of claim 1, where the second adhesive layer is applied using pressure.

11. The assembly of claim 10, where the second adhesive layer is applied to the first interposer layer with a high pressure.

12. The assembly of claim 1, where the second adhesive layer has a thickness ranging from approximately 0.001 to 0.011 inches.

13. The assembly of claim 1, where the heat dissipation device comprises a heat sink or a heat pipe assembly.

14. The assembly of claim 1, where the substantially permanent first adhesive layer comprises a no-pressure adhesive layer.

15. The assembly of claim 1, where the second adhesive layer is a non-epoxy adhesive layer.

16. A re-workable heat dissipation assembly comprising:
a substantially permanent first adhesive layer,
the substantially permanent first adhesive layer having a first dimension and a second dimension;
a first interposer layer adhered to a device via the substantially permanent first adhesive layer,
the first interposer layer having a thickness of approximately 0.001 inches, and
the first interposer layer having the first dimension and the second dimension;
a second substantially permanent adhesive layer adhered to the first interposer layer,
the second substantially permanent adhesive layer having the first dimension and the second dimension;
a second interposer layer adhered to the first interposer layer via the second substantially permanent adhesive layer,
the second interposer layer having the first dimension and the second dimension;
a third adhesive layer adhered to the second interposer layer,
the third adhesive layer comprising a thermally conductive tape, and
the third adhesive layer having the first dimension and the second dimension; and
a heat dissipation device adhered to the third adhesive layer,
at least one of the first interposer layer or the second interposer layer including a non-uniform, irregular, or non-planar surface.

17. The re-workable heat dissipation assembly of claim 16, where the substantially permanent first adhesive layer comprises one of:
a thermally conductive adhesive layer,
a low pressure adhesive layer,
an epoxy adhesive layer, or
a no-pressure adhesive layer.

18. The re-workable heat dissipation assembly of claim 16, where the first interposer layer comprises one of:
   a heat conductive layer, or
   a metallic heat conductive layer.

19. The re-workable heat dissipation assembly of claim 16, where the second substantially permanent adhesive layer is applied using pressure.

20. The re-workable heat dissipation assembly of claim 16, where the heat dissipation device comprises a heat sink or a heat pipe assembly.

* * * * *